United States Patent
Yoon et al.

(10) Patent No.: US 9,865,830 B2
(45) Date of Patent: Jan. 9, 2018

(54) ORGANIC THIN FILM TRANSISTOR, METHOD FOR MANUFACTURING THE SAME AND METHOD FOR RECOVERYING INSULATION THEREOF

(71) Applicant: GWANGJU INSTITUTE OF SCIENCE AND TECHNOLOGY, Gwangju (KR)

(72) Inventors: Myung-Han Yoon, Gwangju (KR); Kookheon Char, Seoul (KR); Eui tae Kim, Seoul (KR); Jae-Hyuk Lee, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 15/184,571

(22) Filed: Jun. 16, 2016

(65) Prior Publication Data
US 2016/0372692 A1    Dec. 22, 2016

(30) Foreign Application Priority Data

Jun. 16, 2015  (KR) .................. 10-2015-0085321
Jun. 2, 2016   (KR) .................. 10-2016-0068825

(51) Int. Cl.
| | |
|---|---|
| H01L 35/24 | (2006.01) |
| H01L 51/05 | (2006.01) |
| H01L 51/10 | (2006.01) |
| H01L 51/00 | (2006.01) |

(52) U.S. Cl.
CPC ........ *H01L 51/052* (2013.01); *H01L 51/0023* (2013.01); *H01L 51/0545* (2013.01); *H01L 51/0558* (2013.01); *H01L 51/105* (2013.01); *H01L 51/0034* (2013.01); *H01L 51/0043* (2013.01); *H01L 2251/301* (2013.01); *H01L 2251/305* (2013.01); *H01L 2251/308* (2013.01)

(58) Field of Classification Search
CPC ............. H01L 51/052; H01L 51/0545; H01L 51/0558; H01L 51/105; H01L 51/0023; H01L 51/0034; H01L 2251/301; H01L 2251/308; H01L 2251/305; H01L 51/0043
USPC .......................................................... 257/40
See application file for complete search history.

(56) References Cited

U.S. PATENT DOCUMENTS

| | | | | |
|---|---|---|---|---|
| 7,619,055 B2 * | 11/2009 | Li | ................. | C08G 61/122 528/363 |
| 2013/0168678 A1 * | 7/2013 | Hayashi | ............. | H01L 29/66765 257/57 |

* cited by examiner

*Primary Examiner* — Vu A Vu
(74) *Attorney, Agent, or Firm* — Hauptman Ham, LLP

(57) ABSTRACT

Provided are an organic thin film transistor, a method for manufacturing the same, and a method for recovering insulation thereof. Specifically, the organic thin film transistor includes a substrate, a gate electrode, a semiconductor pattern, a source electrode, a drain electrode and a gate insulation layer. The gate electrode is disposed on the substrate. The semiconductor pattern is electrically insulated with the gate electrode on the substrate. The source electrode and the drain electrode are each electrically connected to the semiconductor pattern on the substrate, and are separated from each other. The gate insulation layer is disposed between the semiconductor pattern and the gate electrode. The gate insulation layer is a sulfur copolymer thin film.

18 Claims, 12 Drawing Sheets

ORGANIC THIN FILM TRANSISTOR, METHOD FOR MANUFACTURING THE SAME AND METHOD FOR RECOVERYING INSULATION THEREOF

CROSS REFERENCE TO RELATED APPLICATION

This application claims the priority of Korean Patent Application Nos. 10-2015-0085321 filed on Jun. 16, 2015, and 10-2016-0068825 filed on Jun. 2, 2016, in the Korean Intellectual Property Office, the disclosure of which is incorporated herein by reference.

FIELD OF THE INVENTION

The present disclosure relates to an organic thin film transistor, a method for manufacturing the same and a method for recovering insulation thereof, and in particular, to an organic thin film transistor including an organic insulation layer, a method for manufacturing the same and a method for recovering insulation thereof.

BACKGROUND OF THE INVENTION

In the field of electricity industry, much effort on the research and development of low cost insulating materials has been recently made in order to enhance insulation efficiency, to extend an insulation life and to reduce a weight. Generally, insulating materials made of polymers or insulating materials made of ceramics have been used as electric insulator materials. Polymer materials are light weight but have an inferior insulation property compared to ceramics, and ceramics have an excellent insulation property but, unlike polymers, have disadvantages in terms of light-weightness and flexibility.

Organic polymer materials are generally lighter, are not readily broken compared to inorganic materials, and have received attention as a next generation material in electrical equipment requiring flexibility and lightweightness. In addition, with increased developments and demands for micro-miniaturized electrical devices, sizes of thin film transistors included in such electrical devices have also been reduced. Recently, organic materials such as polymethyl methacrylate and polystyrene have been studied as insulating materials for thin film transistors using organic materials (organic thin film transistors).

However, such materials have a problem in that the insulation property declines as the thickness is reduced to a certain level or below. In other words, reducing a thickness of an organic insulation layer included in an organic thin film transistor has a problem of increasing leakage current flowing through the organic insulation layer. This leads to a limit in microminiaturizing sizes of organic thin film transistors.

In addition, when an organic insulation layer undergoes insulation breakdown from a momentary application of high voltage to an organic thin film transistor operating at low voltages, there is a problem in that the organic thin film transistor is degenerated.

SUMMARY OF THE INVENTION

In view of the above, the present disclosure is directed to providing an organic thin film transistor capable of micro-miniaturizing a thickness of an organic insulation layer of the organic thin film transistor, and including an organic insulation layer capable of at least partially recovering insulation in the breakdown of insulation.

The present disclosure is also directed to providing a method for manufacturing such an organic thin film transistor.

The present disclosure is also directed to providing a method for recovering insulation of such an organic thin film transistor.

One embodiment of the present disclosure provides an organic thin film transistor. The organic thin film transistor includes a substrate, a gate electrode, a semiconductor pattern, a source electrode, a drain electrode and a gate insulation layer. The gate electrode is disposed on the substrate. The semiconductor pattern is electrically insulated with the gate electrode on the substrate. The source electrode and the drain electrode are each electrically connected to the semiconductor pattern on the substrate, and are separated from each other. The gate insulation layer is disposed between the semiconductor pattern and the gate electrode. The gate insulation layer is a sulfur copolymer thin film.

The sulfur copolymer thin film may include poly(sulfur-random-1,3-diisopropenylbenzene).

The sulfur copolymer thin film may have more disulfide bonds than carbon-sulfur bonds.

The sulfur copolymer thin film may include sulfur in greater than or equal to 50 parts by weight and less than or equal to 60 parts by weight.

The sulfur copolymer thin film may have a thickness of 50 nm to 200 nm.

The sulfur copolymer thin film may be at least partially insulation recovered by heat treatment in the breakdown of insulation.

The gate insulation layer may be disposed on the gate electrode.

The gate insulation layer may be disposed on the semiconductor pattern.

The source electrode and the drain electrode may be disposed on the semiconductor pattern.

The semiconductor pattern may be disposed on the source electrode and the drain electrode.

The semiconductor pattern may include an organic semiconductor compound.

The organic semiconductor compound may include compounds selected from the group consisting of pentacene, tetracene, dinaphthofuran, dinaphthothiophene, dinaphtho-selenophene, dianthrafuran, dianthrathiophene and dian-thraselenophene.

The gate electrode, the source electrode and the drain electrode may each include materials selected from the group consisting of Ag, Al, Au, Pt, Ta, Ti, Mo, Nb, Cu, In, Ni, Nd, Cr, indium tin oxide (ITO), indium zinc oxide (IZO), aluminum doped zinc oxide (AZO), gallium doped zinc oxide (GZO), indium gallium zinc oxide (IGZO) and indium tin zinc oxide (ITZO), or a conductive polymer.

Another embodiment of the present disclosure provides a method for preparing an organic thin film transistor. In the preparation method, a gate electrode is formed on a substrate. A sulfur copolymer thin film is formed on the substrate so as to cover the gate electrode. A semiconductor pattern is formed on the sulfur copolymer thin film so as to at least partially overlap the gate electrode. A source electrode at least partially overlapping a first end of the semi-conductor pattern, and a drain electrode at least partially overlapping a second end of the semiconductor pattern distinct from the first end of the semiconductor pattern may be formed.

The sulfur copolymer thin film may include poly(sulfur-random-1,3-diisopropenylbenzene).

The sulfur copolymer thin film may include sulfur in greater than or equal to 50 parts by weight and less than or equal to 60 parts by weight.

The forming of a sulfur copolymer thin film on the substrate so as to cover the gate electrode may include forming a sulfur-polymer compound by mixing liquefied sulfur with 1,3-diisopropenylbenzene (DIB), forming a sulfur copolymer mixed solution by dissolving the sulfur-polymer compound in a 1,2-dichlorobenzene (DCB) solvent, and coating the sulfur copolymer mixed solution on the gate electrode-formed substrate.

Still another embodiment of the present disclosure provides a method for recovering insulation of an organic thin film transistor. The insulation recovery method is a method of recovering insulation of an organic thin film transistor including a source electrode and a drain electrode disposed on a substrate, a semiconductor pattern electrically connected to the source electrode and the drain electrode, a gate insulation layer electrically insulating the semiconductor pattern, and a gate electrode insulated with the semiconductor pattern having the gate insulation layer provided in between. The insulation recovery method etches a top electrode on the gate insulation layer. The top electrode-removed gate insulation layer is heat treated. The top electrode is formed again on the heat-treated gate insulation layer. The gate insulation layer is a sulfur copolymer thin film. The top electrode includes at least any one of the source electrode, the drain electrode and the gate electrode.

The heat treatment may include heating the gate insulation layer to 100° C. to 200° C.

BRIEF DESCRIPTION OF THE DRAWINGS

The objects and qualities of the present invention will become apparent from the following description of embodiments given in conjunction with the accompanying drawings, in which.

DETAILED DESCRIPTION OF THE EMBODIMENTS

Figure 1:
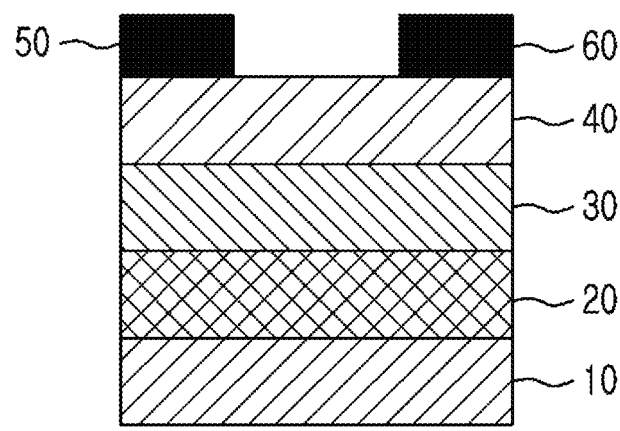
FIG. 1 is a cross-sectional view showing an organic thin film transistor according to one embodiment of the present disclosure.

Hereinafter, the present disclosure will be described in more detail with reference to preferred embodiments of the present disclosure in order to more specifically describe the present disclosure. However, the present disclosure is not limited to the embodiments described herein, and may be specified to other forms.

In the drawings, when a layer is described to be formed "on" another layer or on a substrate, this means that the layer may be directly formed on the other layer or on the substrate, or a third layer may be provided therebetween. In the drawings, thicknesses of layers and regions may be exaggerated or reduced for clarity. Like reference numerals represent like elements throughout the specification.

FIG. 1 to FIG. 4 are cross-sectional views showing an organic thin film transistor according to one embodiment of the present disclosure.

Referring to FIG. 1, the organic thin film transistor according to one embodiment of the present disclosure includes a substrate 10, a gate electrode 20, a gate insulation layer 30, a semiconductor pattern 40, a source electrode 50 and a drain electrode 60.

The substrate 10 is a support substrate on which the organic thin film transistor is disposed, and may include transparent insulating materials. For example, the substrate 10 may include materials such as glass, polyimide, polycarbonate, polyethylene terephthalate, polymethyl methacrylate and acryl. In addition, the substrate 10 may be a flexible substrate.

The gate electrode 20 is a conductive electrode disposed on the substrate 10. The gate electrode 20 may include Ag, Al, Au, Pt, Ta, Ti, Mo, Nb, Cu, In, Ni, Nd, Cr, indium tin oxide, indium zinc oxide, aluminum doped zinc oxide, gallium doped zinc oxide, indium gallium zinc oxide, indium tin zinc oxide, conductive polymers or the like. The conductive polymer may include a mixed polymer of poly (3,4-ethylenedioxythiophene) and polystyrene sulfonic acid, and the like.

The gate insulation layer 30 may be disposed on the gate electrode 20. Depending on the embodiments, the gate insulation layer 30 may be disposed on the substrate 10 so as to cover the whole gate electrode 20.

The gate insulation layer 30 may be a polymer thin film including sulfur. For example, the gate insulation layer 30 may be a sulfur copolymer thin film having more disulfide bonds (S—S) than carbon-sulfur (C—S) bonds. Such a sulfur copolymer thin film may include poly(sulfur-random-1,3-diisopropenylbenzene). However, sulfur-polymer compounds that may be included in the sulfur copolymer thin film may be various sulfur copolymers including disulfide bonds.

Sulfur has a dielectric constant of 3.1 to 3.3, has high electric insulation and low heat conductivity, and particularly, is very inexpensive since it is readily produced as a byproduct of desulfurization processes. However, sulfur present in a powder state has low processibility, and after the sulfur is melted at a high temperature and the temperature is lowered, the sulfur readily crumbles while returning to its original powder state, and accordingly, improvements are required in order to use such an insulation property of sulfur. The inventors of the present disclosure form an electric insulation layer using a sulfur-polymer compound bonding sulfur with a polymer in order to stably use sulfur while using such a property of sulfur.

In the present embodiment, the sulfur copolymer thin film functioning as the gate insulation layer 30 may include approximately 50 parts by weight to 60 parts by weight of sulfur. Such a sulfur weight ratio is a weight ratio preferable for the sulfur copolymer thin film to have an insulation property, and this will be described in more detail with reference to FIG. 9a to FIG. 9d.

Meanwhile, the sulfur copolymer thin film may have a thickness of approximately 200 nm or less. Specifically, the sulfur copolymer thin film may have a thickness of approximately 50 nm to 200 nm or less. By reducing the thickness of the sulfur copolymer thin film to tens of nm as described above, sizes of organic thin film transistors may also be reduced. Such a sulfur copolymer thin film enables smaller thicknesses compared to commonly-used polystyrene (PS) insulation layers or polymethyl methacrylate (PMMA) insulation layers, and accordingly, an organic thin film transistor may be microminiaturized. This will be described in more detail with reference to FIG. 10a to FIG. 10c.

The semiconductor pattern 40 is electrically insulated with the gate electrode 20 having the gate insulation layer 30 provided in between. The semiconductor pattern 40 may be disposed on the substrate 10 so as to at least partially overlap the gate electrode 20. The semiconductor pattern 40 may include low molecular or high molecular organic semiconductor materials. For example, the semiconductor pattern 40 may include polyacene compounds such as pentacene and tetracene. In addition, the semiconductor pattern 40 may include compounds introducing substituents to an acene skeleton, or may include carcogen compounds such as dinaphthofuran, dinaphthothiophene, dinaphthoselenophene, dianthrafuran, dianthrathiophene and dianthraselenophene.

The source electrode 50 may at least partially overlap one end of the semiconductor pattern 40. The drain electrode 60 may at least partially overlap another end of the semiconductor pattern 40. The source electrode 50 and the drain electrode 60 are separated from each other and may be electrically connected to the semiconductor pattern 40. Specifically, the semiconductor pattern 40 may be configured to function as a channel layer between the source electrode and the drain electrode 60 in an organic thin film transistor.

The source electrode 50 and the drain electrode 60 may include the same materials as the gate electrode 20. For example, the source electrode 50 and the drain electrode 60 may include Ag, Al, Au, Pt, Ta, Ti, Mo, Nb, Cu, In, Ni, Nd, Cr, ITO, IZO, AZO, GZO, IGZO, ITZO, conductive polymers and the like. The source electrode 50 and the drain electrode 60 may have a structure in which one or more materials are laminated in a multilayer.

Figure 2:
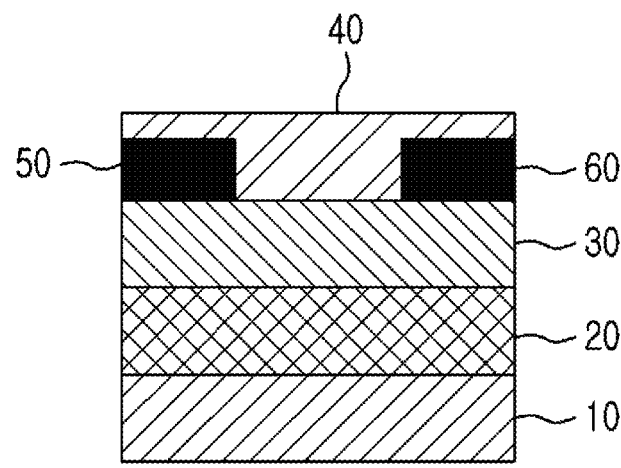
FIG. 2 is a cross-sectional view showing an organic thin film transistor according to one embodiment of the present disclosure.
Figure 3:
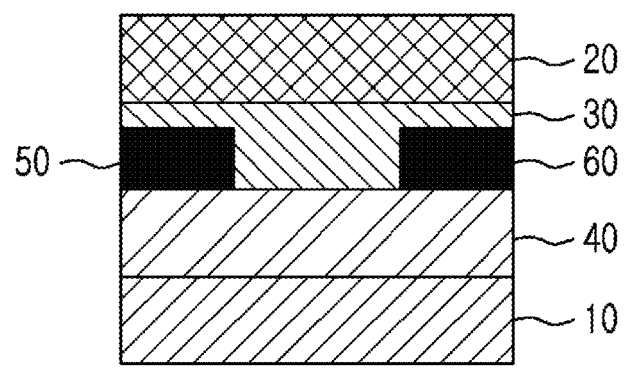
FIG. 3 is a cross-sectional view showing an organic thin film transistor according to one embodiment of the present disclosure.
Figure 4:
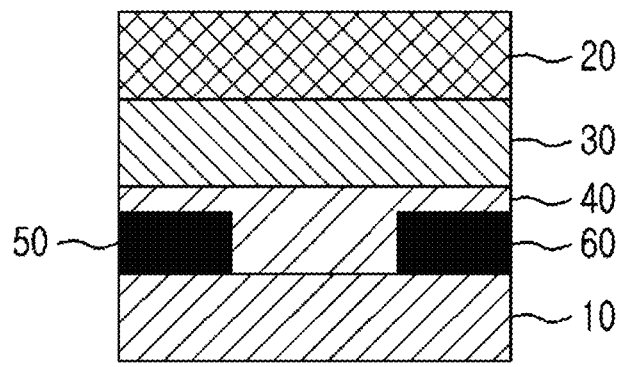
FIG. 4 is a cross-sectional view showing an organic thin film transistor according to one embodiment of the present disclosure.

As shown in FIG. 1, the organic thin film transistor according to the present embodiment may have a bottom-gate/top-contact structure in which the gate electrode 20 is disposed below the semiconductor pattern 40, and the source electrode 50 and the drain electrode 60 are in contact with the semiconductor pattern 40 on the semiconductor pattern 40. However, this is only an illustrative embodiment, and in other embodiments, the organic thin film transistor according to the present disclosure may have various structures such as a bottom-gate/bottom-contact structure (FIG. 2), a top-gate/top-contact structure (FIG. 3) and a top-gate/bottom-contact structure (FIG. 4), as shown in FIG. 2 to FIG. 4. Hereinafter, for the convenience of description, the organic thin film transistor of the present disclosure is described to have a bottom-gate/top-contact structure.

Figure 5A:
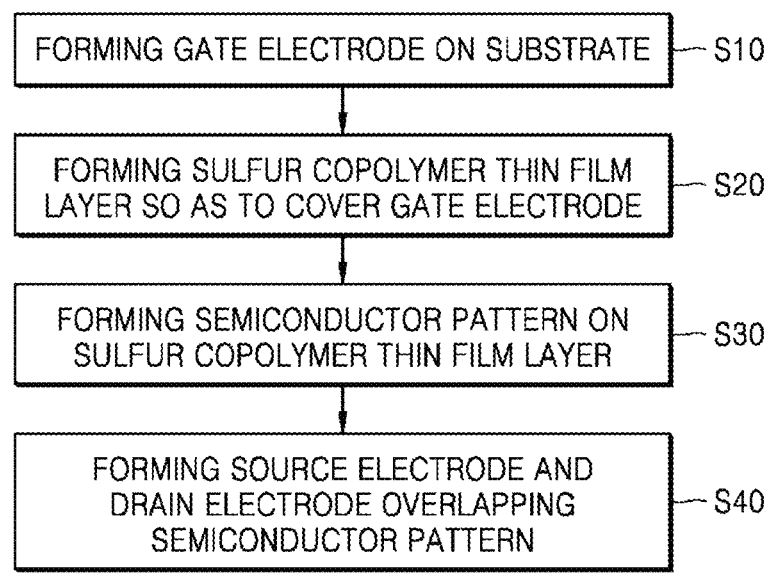
FIG. 5a is a flow chart showing a method for manufacturing an organic thin film transistor according to one embodiment of the present disclosure.
Figure 5B:
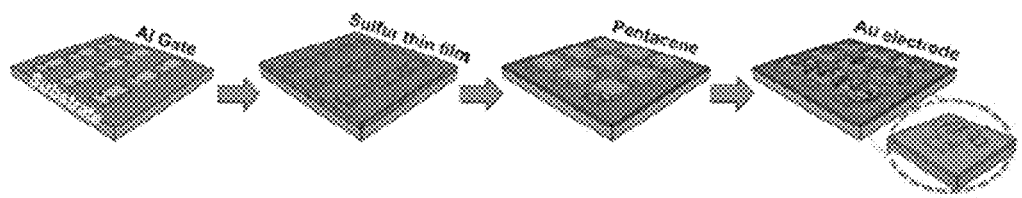
FIG. 5b shows perspective views of a method for manufacturing an organic thin film transistor according to one embodiment of the present disclosure.

FIG. 5a is a flow chart showing a method for manufacturing an organic thin film transistor according to one embodiment of the present disclosure. FIG. 5b shows perspective views of a method for manufacturing an organic thin film transistor according to one embodiment of the present disclosure.

Referring to FIG. 5a and FIG. 5b, a method for manufacturing an organic thin film transistor according to one embodiment of the present disclosure includes forming a gate electrode on a substrate (S10), forming a sulfur copolymer thin film so as to cover the gate electrode (S20), forming a semiconductor pattern on the sulfur copolymer thin film (S30) and forming a source electrode and a drain electrode overlapping the semiconductor pattern (S40).

In FIG. 5b, examples using an aluminum electrode as the gate electrode, a sulfur copolymer thin film including poly (sulfur-random-1,3-diisopropenylbenzene) as the sulfur copolymer thin film, pentacene as the semiconductor pattern, and a gold electrode as the source/drain electrodes are shown. Hereinafter, each step will be described in detail.

In Step S10, a gate electrode may be formed on a substrate. As described above, the substrate is a transparent insulating substrate that may include various materials. The gate electrode may be formed on the substrate using various known methods such as deposition, sputtering, printing and inkjet methods.

In Step S20, a sulfur copolymer thin film may be formed so as to cover the gate electrode. As described above, the sulfur copolymer thin film may include sulfur copolymers having more disulfide bonds than carbon-sulfur bonds. For example, the sulfur copolymer thin film may include 50 parts by weight to 60 parts by weight of sulfur.

Figure 6A:
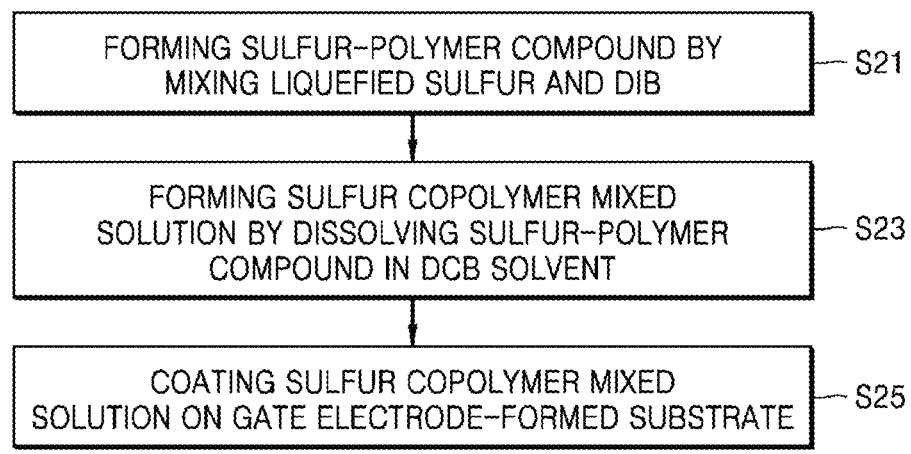
FIG. 6a is a flow chart showing a flow of Step S20 in a method for manufacturing an organic thin film transistor according to one embodiment of the present disclosure.

FIG. 6a is a flow chart showing a flow of Step S20 in the method for manufacturing an organic thin film transistor according to one embodiment of the present disclosure. FIG.

6b is a mimetic diagram showing Steps S21 and S23 in the method for manufacturing an organic thin film transistor according to one embodiment of the present disclosure.

Referring to FIG. 6a, the forming of a sulfur copolymer thin film may include forming a sulfur-polymer compound by mixing liquefied sulfur with 1,3-diisopropenylbenzene (DIB) (S21), forming a sulfur copolymer mixed solution by dissolving the sulfur-polymer compound in a 1,2-dichlorobenzene (DCB) solvent (S23), and coating the sulfur copolymer mixed solution on the gate electrode-formed substrate (S25).

Figure 6B:
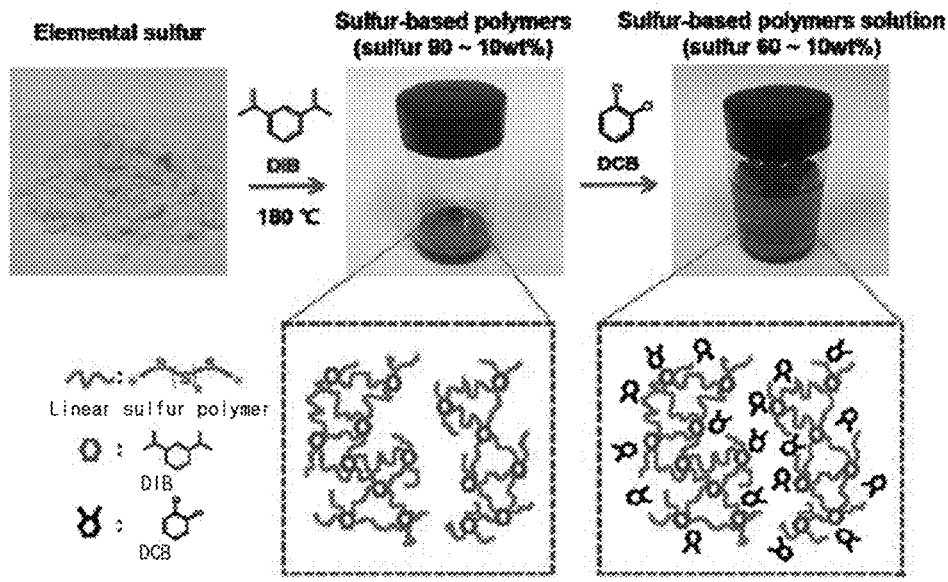
FIG. 6b is a mimetic diagram showing Steps S21 and S23 in a method for manufacturing an organic thin film transistor according to one embodiment of the present disclosure.

In Step S21, elemental sulfur is liquefied to bond to 1,3-diisopropenylbenzene (DIB) in a temperature range of approximately 160° C. to 200° C. and preferably at approximately 180° C. to 190° C. When elemental sulfur is heated to the above-mentioned temperature range, sulfur radicals are produced from the heated sulfur. Herein, when adding DIB to the liquefied sulfur, the sulfur radicals make new bonds of linear disulfide bonds and carbon-sulfur bonds. Accordingly, as shown in the middle picture of FIG. 6b, a sulfur-random-DIB copolymer may be formed. In other words, a sulfur-polymer compound in which DIB bonds in between disulfide bonds (S—S) included in the liquefied sulfur may be formed. In such a sulfur-polymer compound, the sulfur may be included in approximately 10 parts by weight to 90 parts by weight.

In Step S23, a sulfur copolymer mixed solution may be formed by dissolving the formed sulfur-polymer compound in a 1,2-dichlorobenzene (DCB) solvent. Herein, the content of elemental sulfur included in the sulfur copolymer mixed solution may be approximately from 10 parts by weight to 60 parts by weight, and preferably, approximately 50 parts by weight to 60 parts by weight of sulfur may be included. When the sulfur content is greater than 60 parts by weight, length of the disulfide bonds in the DIB increases, and bonds between sulfurs become unstable leading to the breakage of the disulfide bonds, and sulfur tends to precipitate as a ring bonding 8 sulfur elements. Accordingly, the maximum sulfur content included in the sulfur copolymer mixed solution is preferably 60 parts by weight. In addition, the sulfur content included in the sulfur copolymer mixed solution being less than 50 parts by weight has a problem in that an insulation property of the finally formed sulfur copolymer thin film declines (this will be described later). Therefore, the sulfur content included in the sulfur copolymer mixed solution is preferably approximately from 50 parts by weight to 60 parts by weight.

In Step S25, the sulfur copolymer mixed solution may be coated on the gate electrode-formed substrate. For example, the sulfur copolymer mixed solution may be spin-coated on the substrate. The spin-coated sulfur copolymer mixed solution may be annealed under a heating condition, for example, at approximately 180° C., and then cooled to room temperature.

Figure 7A:
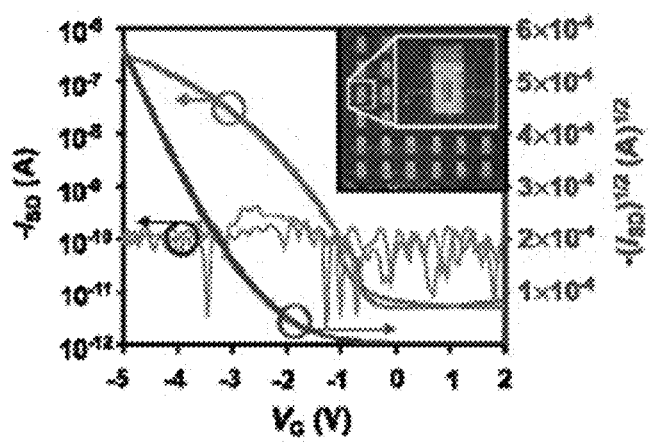
FIG. 7a is a diagram showing electrical properties of the organic thin film transistor of FIG. 5b.
Figure 7B:
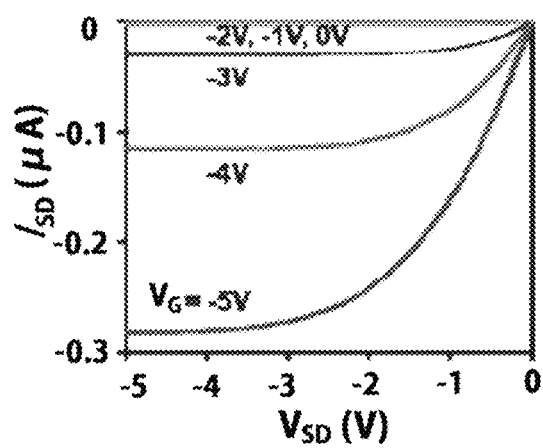
FIG. 7b is a diagram showing electrical properties of the organic thin film transistor of FIG. 5b.

FIG. 7a and FIG. 7b are diagrams showing electrical properties of the organic thin film transistor of FIG. 5b. FIG. 7a shows a transfer property of the organic thin film transistor manufactured according to FIG. 5b, and FIG. 7b shows an output property of the organic thin film transistor. In the present embodiment, the semiconductor pattern of the organic thin film transistor has a thickness of approximately 50 nm, and the source/drain electrodes have a thickness of approximately 40 nm. In addition, the gate insulation layer (sulfur copolymer thin film) of the organic thin film transistor includes approximately 60 parts by weight of sulfur.

Referring to FIG. 7a and FIG. 7b, the organic thin film transistor of the present embodiment exhibits field effect mobility of approximately 0.1 $cm^2/Vs$, has a current one/off ratio of approximately $10^5$, and has a threshold voltage of approximately −1.0 V. In addition, a sub-threshold swing value is approximately 0.5 V/decade. Particularly, such field effect mobility of the organic thin film transistor is higher by approximately three times or more compared to field effect mobility of $SiO_2$-based thin film transistors. Meanwhile, when the sulfur content included in the gate insulation layer (sulfur copolymer thin film) is approximately 50 parts by weight, a lower transfer property compared to the value shown in FIG. 7a is identified (not shown).

Hereinafter, test examples identifying an insulation property of the gate insulation layer (sulfur copolymer thin film) included in the organic thin film transistor according to embodiments of the present disclosure will be described.

Figure 8:
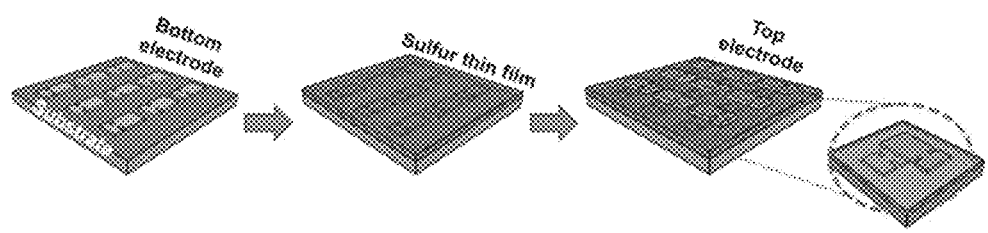
FIG. 8 shows perspective views of a method for manufacturing a metal-insulator-metal (MIM) device for identifying an insulation property of a sulfur copolymer thin film included in an organic thin film transistor according to one embodiment of the present disclosure.

FIG. 8 shows perspective views of a method for manufacturing a metal-insulator-metal (MIM) device for identifying an insulation property of the sulfur copolymer thin film included in the organic thin film transistor according to one embodiment of the present disclosure.

Referring to FIG. 8, a $SiO_2$ substrate having a thickness of approximately 300 nm was pre-cleaned using deionized water (DI water), acetone and isopropanol, and an aluminum electrode was deposited on the pre-cleaned substrate to a thickness of approximately 35 nm as a bottom electrode using a thermal evaporator.

After that, a sulfur copolymer mixed solution prepared in advance was coated thereon to a thickness of approximately 50 nm, and a gold electrode was deposited thereon to a thickness of approximately 35 nm as a top electrode using a thermal evaporator again.

Herein, the sulfur copolymer mixed solution was prepared as follows. First, elemental sulfur powder provided from Sigma-Aldrich, Co. LLC., and 1,3-diisopropenylbenzene (DIB) provided from TCI Co., Ltd. were mixed in a 20 ml glass bottle so that the sulfur content each became 60 parts by weight (sulfur: 1.2 g, DIB: 0.8 g), 50 parts by weight (sulfur: 1.0 g, DIB: 1.0 g), 40 parts by weight (sulfur: 0.8 g, DIB: 1.2 g), 30 parts by weight (sulfur: 0.6 g, DIB: 1.4 g), 20 parts by weight (sulfur: 0.4 g, DIB: 1.6 g) and 10 parts by weight (sulfur: 0.2 g, DIB: 1.8 g), and then the mixture was heat treated for 15 minutes at 180° C. to form a sulfur-polymer compound. Subsequently, 13.3 ml of 1,2-dichlorobenzene (DCB) (anhydrous, 99%) provided from Sigma-Aldrich Co. LLC. was added thereto, and the glass bottle was heated for 24 hours at 100° C. to form a sulfur copolymer mixed solution.

Figure 9A:
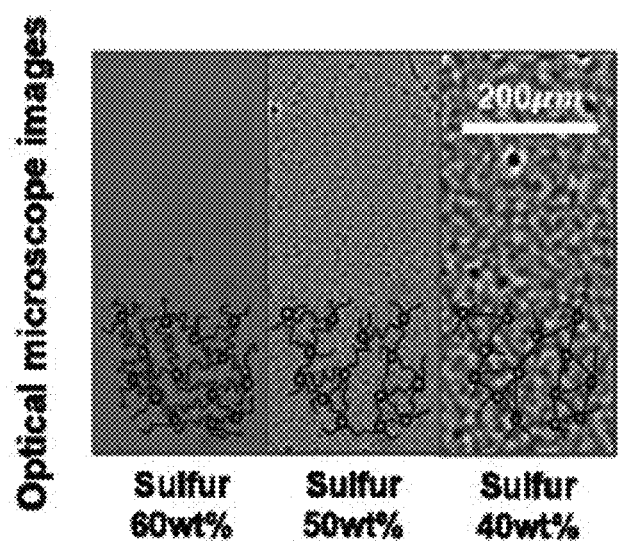
FIG. 9a shows top plan views expanding a surface of the sulfur copolymer thin film of FIG. 8.
Figure 9B:
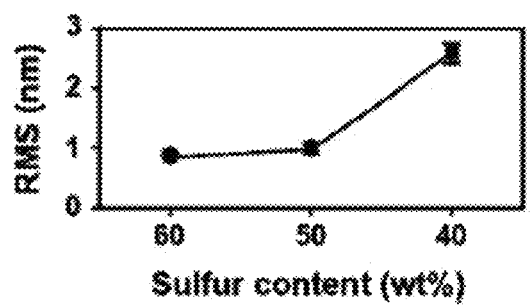
FIG. 9b is a diagram showing surface roughness depending on sulfur content of the sulfur copolymer thin film of FIG. 8.
Figure 9C:
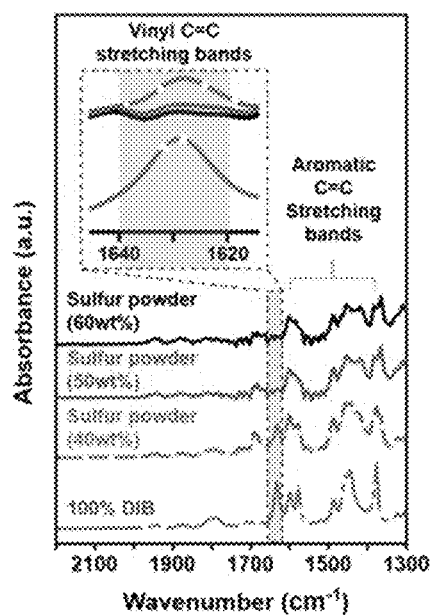
FIG. 9c and FIG. 9d are diagrams showing Fourier transform infrared spectroscopy (FTIR) depending on sulfur content of the sulfur copolymer thin film of FIG. 8.
Figure 9D:
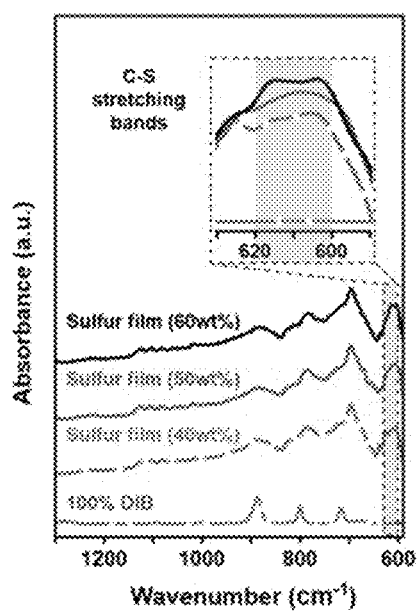

FIG. 9a shows top plan views expanding the surface of the sulfur copolymer thin film of FIG. 8. FIG. 9b is a diagram showing surface roughness depending on the sulfur content of the sulfur copolymer thin film of FIG. 8. FIG. 9c and FIG. 9d are diagrams showing Fourier transform infrared spectroscopy (FTIR) depending on the sulfur content of the sulfur copolymer thin film of FIG. 8.

Referring to FIG. 9a, it was identified that the surface of the sulfur copolymer thin film had reduced surface roughness and became smooth as the sulfur content increased. This is presumed to be due to the fact that sulfur radicals produced from disulfide bonds during the annealing process at 180° C. change surface morphology by reconstituting a chemical structure of the sulfur copolymer thin film. Accordingly, it can be seen that the surface of the thin film including more disulfide bonds and having higher sulfur content is smoother. In FIG. 9a, internal pictures under the optical images represent mimetic diagrams of related sulfur-polymer bonds.

FIG. 9b shows root-mean-square (RMS) roughness of the sulfur copolymer thin film depending on the sulfur content. As shown in FIG. 9a and FIG. 9b, it was identified that the sulfur copolymer thin film including sulfur in 50 parts by weight to 60 parts by weight had lower surface roughness than the sulfur copolymer thin film including sulfur in 40 parts by weight. Although not shown herein, the sulfur copolymer thin film was not favorably coated on the substrate, and significantly higher surface roughness was shown when the sulfur content was less than 40 parts by weight.

Referring to FIG. 9c and FIG. 9d, Fourier transform infrared spectroscopy (FTIR) results for the sulfur copolymer thin films each including sulfur in 40 parts by weight, 50 parts by weight and 60 parts by weight are shown. FIG. 9c shows spectroscopy for identifying carbon-carbon double bonds (C=C), and FIG. 9d shows spectroscopy for identifying carbon-sulfur (C—S) bonds. Referring to FIG. 9c and FIG. 9d, it was identified that, as the sulfur content increased, band intensity of vinyl C=C bonds decreased near 1630 $cm^{-1}$ (FIG. 9c), and band intensity of carbon-sulfur bonds increased near 610 $cm^{-1}$ (FIG. 9d). Accordingly, carbon-carbon double bonds are presumed to be converted to carbon-sulfur bonds as the sulfur content increases.

Meanwhile, when the sulfur content is 60% by weight, more disulfide bonds (S—S) may be present than carbon-sulfur (C—S) bonds in the sulfur copolymer thin film. However, when the sulfur content is from 50% by weight to 60% by weight, disulfide bonds (S—S) may be included in a similar level or less compared to carbon-sulfur (C—S) bonds depending on the concentration.

Figure 10A:
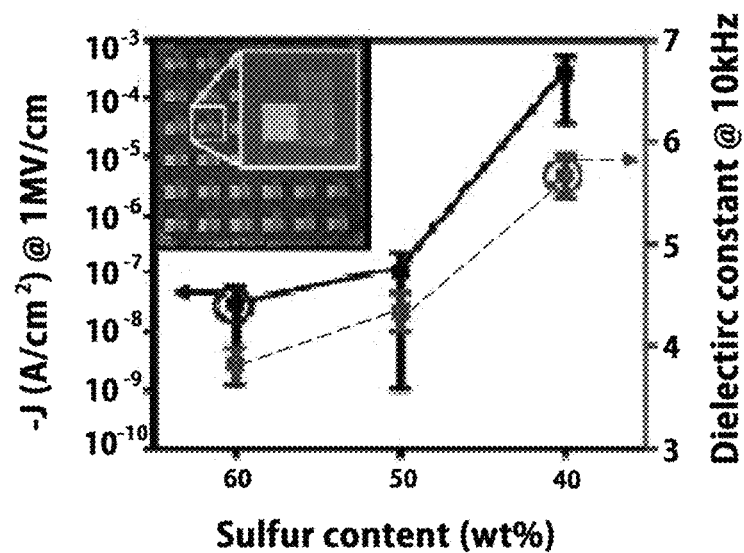
FIG. 10a is a diagram showing an insulation property depending on the content of sulfur included in the sulfur copolymer thin film of the MIM device of FIG. 8.
Figure 10B:
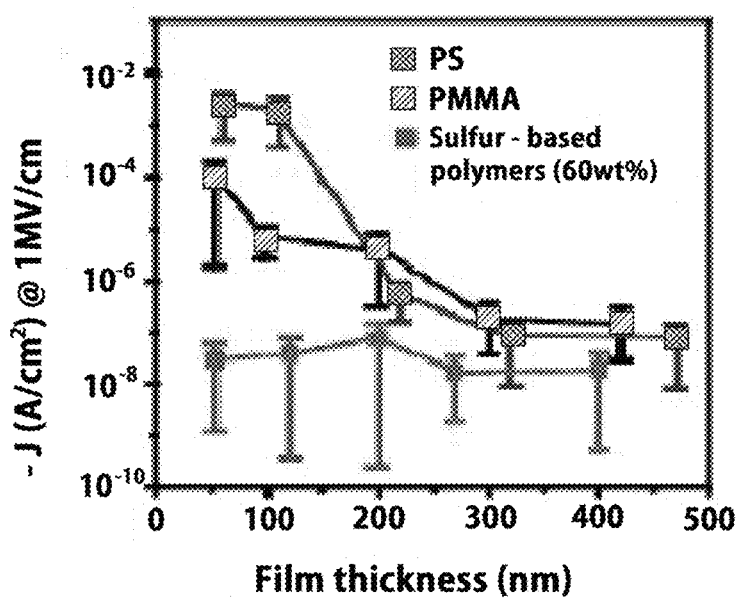
FIG. 10b is a diagram comparing an insulation property depending on a thickness of the sulfur copolymer thin film of the MIM device of FIG. 8 with other organic insulation layers.
Figure 10C:
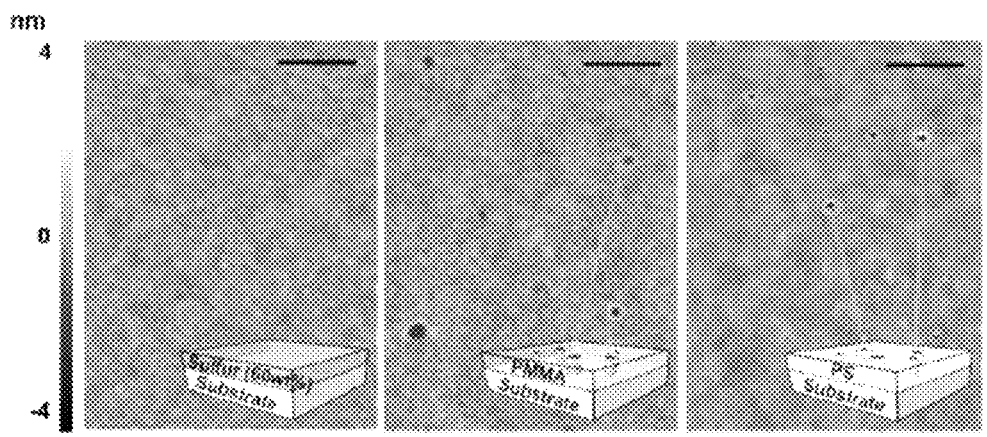
FIG. 10c shows top plan views expanding surfaces of the organic insulation layers used in FIG. 10b.

FIG. 10a is a diagram showing an insulation property depending on the content of sulfur included in the sulfur copolymer thin film of the MIM device of FIG. 8. FIG. 10b is a diagram comparing an insulation property depending on the thickness of the sulfur copolymer thin film of the MIM device of FIG. 8 with other organic insulation layers. FIG. 10c shows top plan views expanding the surfaces of the organic insulation layers used in FIG. 10b.

FIG. 10a shows leakage current density and dielectric constant-k of the sulfur copolymer thin film depending on the sulfur content. In order to have an excellent insulation property in general, leakage current density needs to be low in a high electric field, and an insulator needs to endure a high voltage without the breakdown of insulation.

In FIG. 10a, it was identified that leakage current density decreased and a dielectric constant decreased as well as the sulfur content of the sulfur copolymer thin film increased. Specifically, when the sulfur content of the sulfur copolymer thin film was 60 parts by weight, 50 parts by weight and 40 parts by weight, average leakage current density at 1.0 MV/cm was identified to be $-3.0 \times 10^{-8}$ $A/cm^2$, $-1.1 \times 10^{-7}$ $A/cm^{-2}$ and $-2.7 \times 10^{-4}$ $A/cm^2$, respectively. In addition, in each case, the dielectric constant was identified to be 3.8, 4.3 and 5.7 at 10 kHz. The dielectric constant of the sulfur copolymer thin film with the sulfur content of 60 parts by weight was close to the dielectric constant of elemental sulfur (k=3.2).

As described above, the leakage current density decreasing with an increase in the sulfur content of the sulfur copolymer thin film relates to surface roughness of the sulfur copolymer thin film. In other words, when surface roughness of the sulfur copolymer thin film is high, fine protrusions (grain/island) are formed on the thin film surface, and such protrusions may function as a charge transfer path or an electron accumulation point, which may cause insulation breakdown.

FIG. 10b and FIG. 10c are diagrams comparing properties of insulation layers including each of polymethyl methacrylate (PMMA) and polystyrene (PS) capable of being used as a polymer insulating material with the sulfur copolymer thin film according to one embodiment of the present disclosure.

In FIG. 10b, when the thickness was 300 nm or greater, the leakage current density of each of the PMMA insulation layer and the PS insulation layer was low of $-1.0 \times 10^{-6}$ $A/cm^2$ at 1.0 MV/cm. However, when the thin film thickness was 200 nm or less, it was identified that the leakage current density of the PMMA insulation layer and the PS insulation layer significantly increased to $-1.0 \times 10^{-5}$ $A/cm^2$ or greater at 1.0 MV/cm. On the contrary, the sulfur copolymer thin film maintained low leakage current density even in a thickness range of 200 nm or less, specifically, a thickness range of approximately 50 nm to 200 nm. Accordingly, when using the sulfur copolymer thin film as an insulation layer of a thin film transistor, an insulation property is maintained even when the insulation layer has a reduced thickness, and therefore, microminiaturized organic thin film transistors may be obtained.

FIG. 10c shows, from the left, expanded views of the surfaces of the sulfur copolymer thin film, the PMMA insulator film and the PS insulator film. The bar shown at the upper right corner of the surface optical image in FIG. 10c represents a length of 200 nm. In addition, dark dots in each of the surface images represent pin holes. As identified in FIG. 10c, it was identified that pin holes are partially distributed on the surfaces of the PMMA insulator film and the PS insulator film. On the contrary, almost no pin holes were present in the sulfur copolymer thin film, and this is due to the fact that sulfur polymers are rearranged during the annealing process. In other words, by the sulfur-polymer compound having liquidity from the heat treatment, and radicals generated from disulfide bonds included in such a sulfur-polymer compound changing a chemical structure of the sulfur copolymer, the number of pin holes on the surface of the sulfur copolymer thin film is presumed to decrease.

As described above, it is seen that the sulfur copolymer thin film according to one embodiment of the present disclosure having an excellent insulation property is due to the fact that, as the sulfur content increases, surface roughness of the sulfur copolymer thin film is improved by the radicals generated from disulfide bonds, and the number of pin holes decreases.

Hereinafter, a method for recovering insulation using such a surface improving property when the sulfur copolymer thin film undergoes insulation breakdown will be described. The descriptions below are based upon an organic thin film device having a structure of top electrode/insulation layer/bottom electrode that may be included in an organic thin film transistor so that descriptions on recovering insulation of a gate insulation layer is simple.

Figure 11:
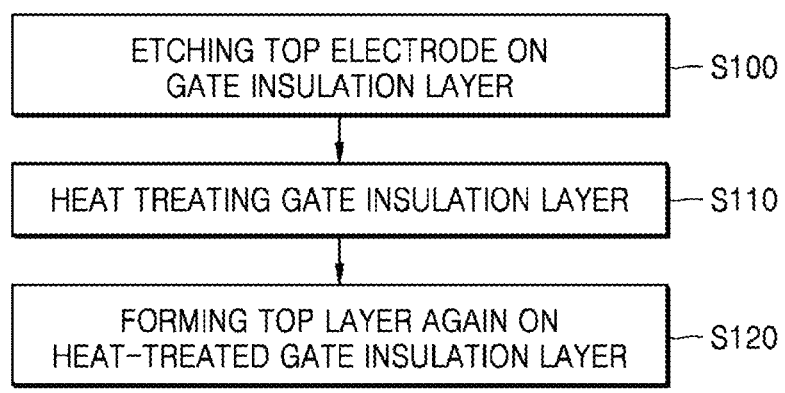
FIG. 11 is a flow chart showing a method for recovering insulation of an organic thin film device that may be included in an organic thin film transistor according to one embodiment of the present disclosure.
Figure 12A:
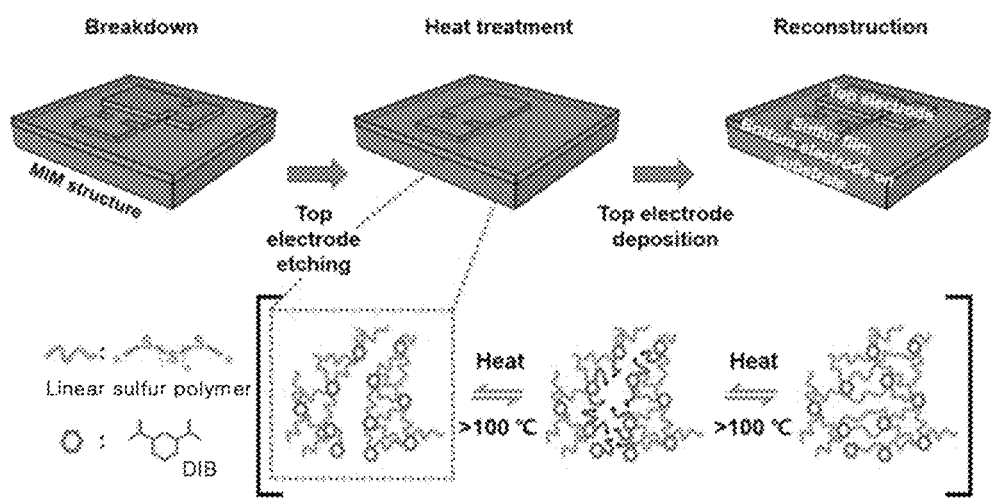
FIG. 12a shows perspective views of a method for recovering insulation of an organic thin film device that may be included in an organic thin film transistor according to one embodiment of the present disclosure.
Figure 12B:
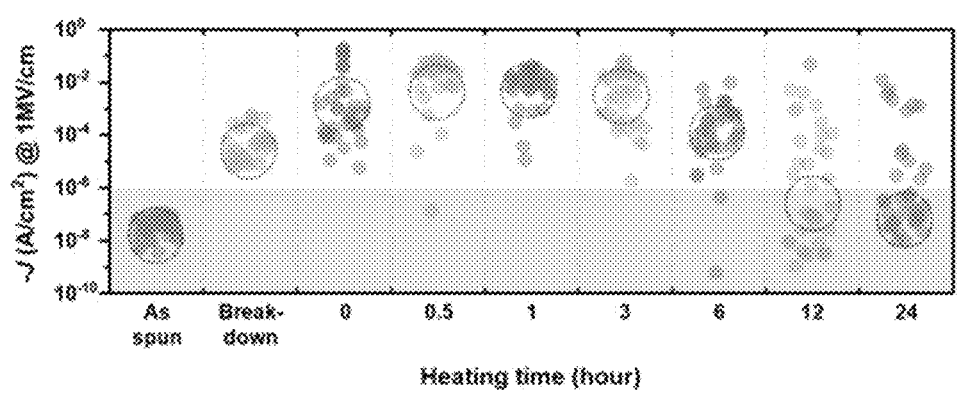
FIG. 12b is a diagram showing a trend of insulation property recovery of the organic thin film device of FIG. 12a depending on heat treatment time.

FIG. 11 is a flow chart showing a method for recovering insulation of an organic thin film device that may be included in the organic thin film transistor according to one embodiment of the present disclosure. FIG. 12a shows perspective views of a method for recovering insulation of an organic thin film device that may be included in the organic thin film transistor according to one embodiment of the present disclosure. FIG. 12b is a diagram showing a trend of insulation property recovery of the organic thin film device of FIG. 12a depending on heat treatment time.

Referring to FIG. 11 and FIG. 12a, the method for recovering insulation of the an organic thin film device according to the present embodiment may include etching a top electrode on a gate insulation layer (S100), heat treating the top electrode-removed gate insulation layer (S110) and forming the top electrode again on the heat-treated gate insulation layer (S120).

In Step S100, when a sulfur copolymer thin film undergoes insulation breakdown due to the momentary generation of high voltage on an organic thin film device including the sulfur copolymer thin film as a gate insulation layer, a top electrode disposed on the sulfur copolymer thin film may be etched in order to recover insulation of the sulfur copolymer thin film. The top electrode may include a gate electrode, or at least any one of a source electrode and a drain electrode. For example, when the organic thin film device is included in an organic thin film transistor having a top-gate structure, a gate electrode disposed on a gate insulation layer may be etched. In contrast, when the organic thin film device is included in an organic thin film transistor having a bottom-gate structure, at least any one of a source electrode and a drain electrode disposed on a gate insulation layer may be etched. Meanwhile, when the top electrode includes Au, the top electrode may be removed using an Au etching solution.

In Step S110, the top electrode-removed gate insulation layer may be heat treated. The heat treatment temperature in this step may be approximately 100° C. or higher. For example, the heat treatment temperature may be approximately from 100° C. to 200° C. As identified in the chemical bond mimetic diagram of FIG. 12a, radicals generated from disulfide bonds disconnected due to insulation breakdown may rearrange the chemical structure so as to form disulfide bonds again when the sulfur copolymer thin film is heat treated. However, an upper limit of the heat treatment temperature in this case may be properly set so that other electrodes/insulation layers of an organic thin film device other than the sulfur copolymer thin film are not affected by the heat treatment.

In Step S120, the top electrode may be formed on the heat-treated gate insulation layer again. By forming the top electrode etched in Step S100 after recovering insulation of the sulfur copolymer thin film, an organic thin film device degenerated due to insulation breakdown may be recovered.

FIG. 12b shows leakage current density prior to and after insulation breakdown of the sulfur copolymer thin film depending on the heat treatment time. The sulfur copolymer thin film used to have lower leakage current density than $-1.0 \times 10^{-6}$ A/cm$^2$ at 1 MV/cm prior to insulation breakdown had increased leakage current density of up to $-1.0 \times 10^{-4}$ A/cm$^2$ after the insulation breakdown. However, it was identified that, by heat treating the film for approximately 12 hours or longer (preferably, heat treating the film for approximately 24 hours or longer), approximately 50% of the sulfur copolymer thin film recovered insulation to have lower leakage current density than $-1.0 \times 10^{-6}$ A/cm$^2$.

As described above, according to the present disclosure, a thickness of an organic insulation layer of an organic thin film transistor may be greatly reduced by the organic thin film transistor including a sulfur copolymer thin film having an excellent insulation property at a small thickness as a gate insulation layer.

In addition, when the sulfur copolymer thin film of the organic thin film transistor undergoes insulation breakdown, an insulation property of the insulation destructed organic insulation layer may be at least partially recovered by heat treating the insulation destructed sulfur copolymer thin film.

Furthermore, manufacturing costs of an organic thin film transistor may be reduced since raw materials of the sulfur copolymer thin film functioning as a gate insulation layer are inexpensive and flexible, and the organic thin film transistor may be used in flexible electrical devices.

However, effects of the present disclosure are not limited to the effects described above, and other effects that have not been mentioned will be clearly understood for those skilled in the art from the descriptions made above.

Meanwhile, embodiments of the present disclosure disclosed in the present specification and the drawings are illustrative purposes only and are provided to illuminate the present disclosure, and the scope of the present disclosure is not limited thereto. It will apparent to those skilled in the art that various other modifications based on technological ideas of the present disclosure are also covered in addition to the embodiments disclosed herein.

What is claimed is:

1. An organic thin film transistor comprising:
   a substrate;
   a gate electrode disposed on the substrate;
   a semiconductor pattern electrically insulated with the gate electrode on the substrate;
   a source electrode and a drain electrode electrically connected to the semiconductor pattern on the substrate and separated from each other; and
   a gate insulation layer disposed between the semiconductor pattern and the gate electrode,
   wherein the gate insulation layer is a sulfur copolymer thin film, and
   wherein the sulfur copolymer thin film has more disulfide bonds than carbon-sulfur bonds.

2. The organic thin film transistor of claim 1, wherein the sulfur copolymer thin film includes poly(sulfur-random-1,3-diisopropenylbenzene).

3. The organic thin film transistor of claim 1, wherein the sulfur copolymer thin film includes sulfur in greater than or equal to 50 parts by weight and less than or equal to 60 parts by weight.

4. The organic thin film transistor of claim 1, wherein the sulfur copolymer thin film has a thickness of 50 nm to 200 nm.

5. The organic thin film transistor of claim 1, wherein the sulfur copolymer thin film is at least partially insulation recovered by heat treatment in the breakdown of insulation.

6. The organic thin film transistor of claim 1, wherein the gate insulation layer is disposed on the gate electrode.

7. The organic thin film transistor of claim 1, wherein the gate insulation layer is disposed on the semiconductor pattern.

8. The organic thin film transistor of claim 1, wherein the source electrode and the drain electrode are disposed on the semiconductor pattern.

9. The organic thin film transistor of claim 1, wherein the semiconductor pattern is disposed on the source electrode and the drain electrode.

10. The organic thin film transistor of claim 1, wherein the semiconductor pattern includes an organic semiconductor compound.

11. The organic thin film transistor of claim 10, wherein the organic semiconductor compound includes a compound selected from the group consisting of pentacene, tetracene, dinaphthofuran, dinaphthothiophene, dinaphthoselenophene, dianthrafuran, dianthrathiophene and dianthraselenophene.

12. The organic thin film transistor of claim 1, wherein the gate electrode, the source electrode and the drain electrode each include a material selected from the group consisting of Ag, Al, Au, Pt, Ta, Ti, Mo, Nb, Cu, In, Ni, Nd, Cr, indium tin oxide (ITO), indium zinc oxide (IZO), aluminum doped zinc oxide (AZO), gallium doped zinc oxide (GZO), indium gallium zinc oxide (IGZO) and indium tin zinc oxide (ITZO), or a conductive polymer.

13. A method for manufacturing an organic thin film transistor, the method comprising:
forming a gate electrode on a substrate;
forming a sulfur copolymer thin film on the substrate so as to cover the gate electrode;
forming a semiconductor pattern on the sulfur copolymer thin film so as to at least partially overlap the gate electrode; and
forming a source electrode at least partially overlapping a first end of the semiconductor pattern, and forming a drain electrode at least partially overlapping a second end of the semiconductor pattern distinct from the first end of the semiconductor pattern,
wherein the sulfur copolymer thin film has more disulfide bonds than carbon-sulfur bonds.

14. The method for manufacturing an organic thin film transistor of claim 13, wherein the sulfur copolymer thin film includes poly(sulfur-random-1,3-diisopropenylbenzene).

15. The method for manufacturing an organic thin film transistor of claim 13, wherein the sulfur copolymer thin film includes sulfur in greater than or equal to 50 parts by weight and less than or equal to 60 parts by weight.

16. The method for manufacturing an organic thin film transistor of claim 13, wherein the forming of a sulfur copolymer thin film on the substrate so as to cover the gate electrode includes forming a sulfur-polymer compound by mixing liquefied sulfur with 1,3-diisopropenylbenzene (DIB); forming a sulfur copolymer mixed solution by dissolving the sulfur-polymer compound in a 1,2-dichlorobenzene (DCB) solvent; and coating the sulfur copolymer mixed solution on the gate electrode-formed substrate.

17. A method for recovering insulation of an organic thin film transistor that includes a source electrode and a drain electrode disposed on a substrate, a semiconductor pattern electrically connected to the source electrode and the drain electrode, a gate insulation layer electrically insulating the semiconductor pattern, and a gate electrode insulated with the semiconductor pattern having the gate insulation layer provided in between, the method comprising:
etching a top electrode on the gate insulation layer;
heat treating the top electrode-removed gate insulation layer; and
forming the top electrode again on the heat-treated gate insulation layer,
wherein the gate insulation layer is a sulfur copolymer thin film,
wherein the sulfur copolymer thin film has more disulfide bonds than carbon-sulfur bonds, and
wherein the top electrode includes at least any one of the source electrode, the drain electrode and the gate electrode.

18. The method for recovering insulation of an organic thin film transistor of claim 17, wherein the heat treatment includes heating the gate insulation layer to 100° C. to 200° C.

* * * * *